(12) United States Patent
Van Empel

(10) Patent No.: US 6,232,615 B1
(45) Date of Patent: May 15, 2001

(54) LITHOGRAPHIC PROJECTION APPARATUS WITH IMPROVED SUBSTRATE HOLDER

(75) Inventor: Tjarko Van Empel, Eindhoven (NL)

(73) Assignee: ASM Lithography B.V., Veldhoven (NL)

( * ) Notice: Subject to any disclaimer, the term of this patent is extended or adjusted under 35 U.S.C. 154(b) by 0 days.

(21) Appl. No.: 09/280,064

(22) Filed: Mar. 29, 1999

(30) Foreign Application Priority Data

Mar. 31, 1998 (EP) .................................................. 98201004

(51) Int. Cl.$^7$ .................................................. G01N 21/86
(52) U.S. Cl. ........................................ 250/548; 250/559.3
(58) Field of Search .................................. 250/548, 559.3, 250/492.22, 492.2; 356/399–401; 355/53

(56) References Cited

U.S. PATENT DOCUMENTS 5,374,829 * 12/1994 Sakamoto et al. .............. 250/453.11

* cited by examiner

Primary Examiner—Que T. Le
(74) Attorney, Agent, or Firm—Pillsbury Winthrop LLP

(57) ABSTRACT

A lithographic projection apparatus comprising:
  a radiation system (7) for supplying a projection beam (25) of radiation;
  a mask table (5) provided with a mask holder (27) for holding a mask (29);
  a substrate table (1) provided with a substrate holder (17) for holding a substrate (19);
  a projection system (3) for imaging an irradiated portion of the mask (29) onto a target portion (35) of the substrate (19), the substrate holder (17) comprising a plate (2) having a face (4) which is provided with a matrix arrangement of protrusions (6), each protrusion (6) having an extremity (6') remote from the face (4) and being thus embodied that the said extremities (6') all lie within a single substantially flat plane (6") at a height H above the face (4), the substrate holder (17) further comprising a wall (8) which protrudes from the face (4), substantially encloses the matrix arrangement, and has a substantially uniform height h above the face (4), whereby h<H, the face (4) inside the wall (8) being provided with at least one aperture (10) extending through the plate (4) and through which the area enclosed by the wall (8) can be accessed, whereby:

the matrix arrangement comprises a series of concentric circles (12) whereby the protrusions (6) are disposed along each circle (12) at substantially regular accurate intervals;
  the wall (8) is substantially circular, and is concentric with the said circles (12);
  the radial distance x between the wall (8) and the circle (12) nearest thereto satisfies the relationship 0.3<x/d<0.6, where d is the mutual radial separation of the two circles (12) nearest the wall (8).

9 Claims, 3 Drawing Sheets

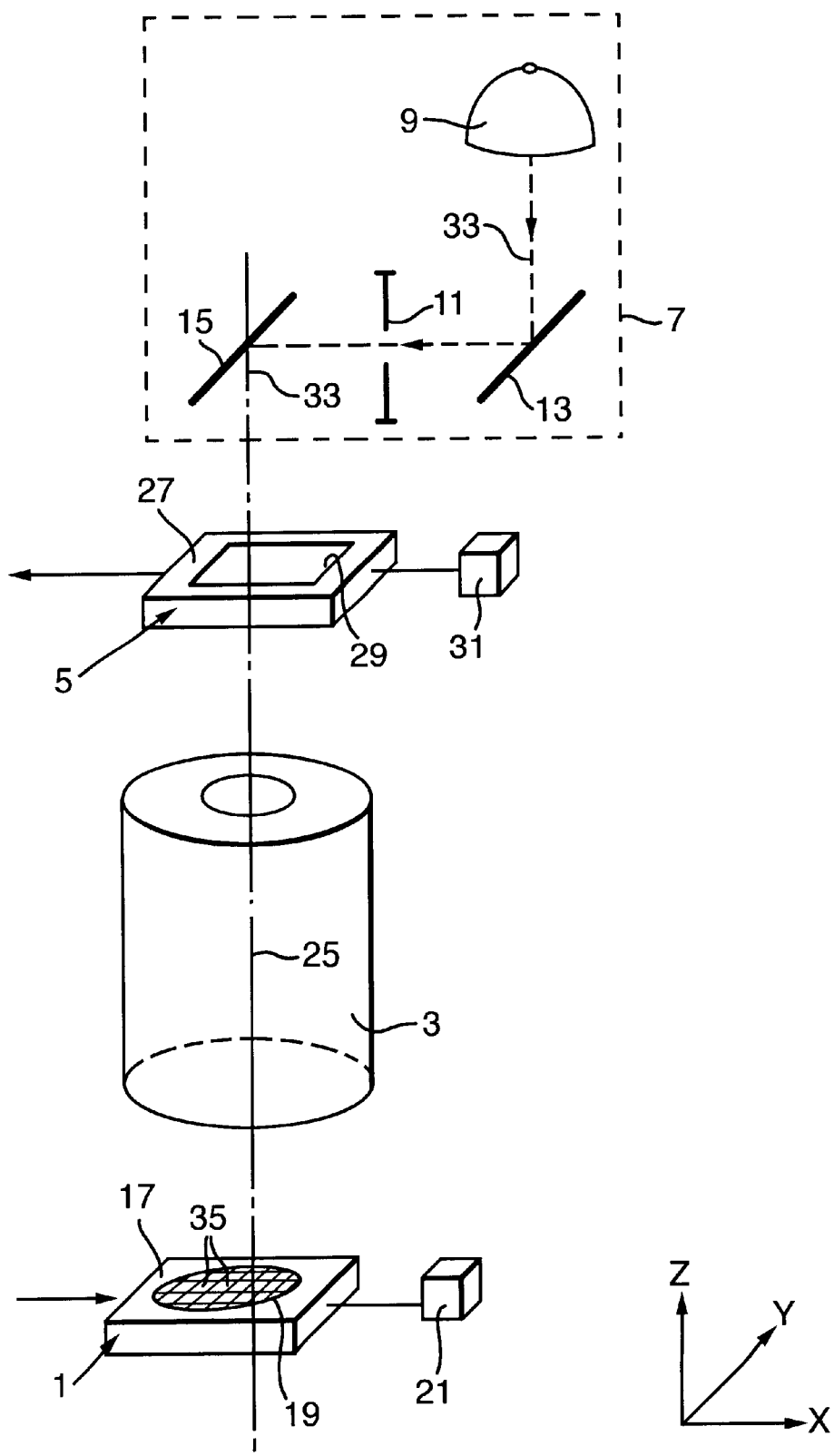

LITHOGRAPHIC PROJECTION APPARATUS WITH IMPROVED SUBSTRATE HOLDER

BACKGROUND OF THE INVENTION

1. Field of the Invention

The invention relates to a lithographic projection apparatus, and more particularly to a lithographic projection apparatus.

2. Description of Related Art

An apparatus of this type can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies which are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the mult-stage apparatus described in International Patent Applications WO 98/28665 (P-0071) and WO 98/40791 (P-0101). The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

In order to achieve good image definition and layer overlay in each die, the irradiated surface of the wafer should be kept as flat and as stationary as possible during exposure of the wafer. Known lithographic apparatus addresses these demands using the substrate holder hereabove specified, on which a wafer can be placed so that its backside is in contact with the protrusions, all of which lie in a well-defined plane. By connecting the aperture(s) in the plate to vacuum generating means, the backside of the wafer can be sucked securely against the protrusions, whereby the wall serves to contain the partial vacuum thereby required; to this end, the wall geometry must be matched to a given wafer diameter, so that the wafer overshoots the wall (typically by a margin of the order of about 2 mm). The use of protrusions in this manner ensures that only a fraction of the area of the backside is actually pressed against a solid surface; in this way, the distorting effect of any particulate contamination on the backside of the wafer is minimized, since such contamination will most probably be situated in the empty spaces between protrusions rather than being pressed against the top surface of a protrusion.

A problem with this known approach is that, since the wafer rests on a discrete number of protrusions rather than a continuous flat surface, and since the backside of the surface is sucked forcefully against such protrusions, the (elastic) wafer can tend to "sag" in areas where it is not supported by a protrusion. This effect can be a particular nuisance along the edge of the wafer, where the resulting distortion of wafer flatness can result in poor-quality edge dies.

SUMMARY OF THE INVENTION

It is an object of the invention to alleviate this problem. More specifically, it is an object of the invention to provide a lithographic projection apparatus having a substrate holder which ensures excellent substrate flatness over the whole surface of a substrate held thereupon. In particular, it is an object of the invention that, when a semiconductor wafer is held on such a substrate holder, the flatness of the wafer's edges should fall within the specifications required to produce satisfactory edge dies, at least for resolutions down to 0.20 µm.

The invention relates to a lithographic projection apparatus comprising:

- a radiation system for supplying a projection beam of radiation;
- a mask table provided with a mask holder for holding a mask;
- a substrate table provided with a substrate holder for holding a substrate;
- a projection system for imaging an irradiated portion of the mask onto a target portion of the substrate, the substrate holder comprising a plate having a face which is provided with a matrix arrangement of protrusions, each protrusion having an extremity remote from the face and being thus embodied that the said extremities all lie within a single substantially flat plane at a height H above the face, the substrate holder further comprising a wall which protrudes from the face, substantially encloses the matrix arrangement, and has a substantially uniform height h above the face, whereby h<H, the face inside the wall being provided with at least one aperture extending through the plate and through which the area enclosed by the wall can be accessed.

These and other objects are achieved in an apparatus as specified in the opening paragraph, characterized in that:

- the matrix arrangement comprises a series of concentric circles whereby the protrusions are disposed along each circle at substantially regular accurate intervals;
- the wall is substantially circular, and is concentric with the said circles;
- the radial distance x between the wall and the circle nearest thereto satisfies the relationship $0.3 < x/d < 0.6$, where d is the mutual radial separation of the two circles nearest the wall.

In experiments leading to the invention, the inventor arrived at the insight that the deviation from flatness along the edge of a wafer on the known substrate holder was dependent on a number of factors, including the form of the matrix distribution of protrusions, the form of the wall, and the interface between the wall and the protrusions. After performing numerical modeling and subsequent tests, it was found that edge flatness was improved if a uniform separation x was maintained between the wall and the outlying protrusions of the enclosed matrix distribution. However, this measure in itself was not enough to ensure acceptable edge flatness, and any attempts to tune the value of x led to confusing results, whereby unacceptable edge flatness was observed both for relatively small and relatively large values of x. Upon further analysis, it transpired surprisingly that the value of x had an effect not only on the magnitude of the distortion (deflection) along the edge of the wafer, but also on its sign, i.e. the wafer could deflect up or down relative to the face. Taking this into account, subsequent refinements by the inventor produced a range of values of x for which the sign of the distortion was substantially zero, or at least only weakly positive or negative. Surprisingly, it was found that this range of values was substantially independent of the height h of the wall relative to the height of the protrusions. Summarizing, following conditions were derived:

In order to ensure a uniform value of x, the wall should be equidistant from the outlying protrusions. To ensure optimum support of circular wafers, the wall and the outlying portion of the matrix distribution therefore should have concentric circular geometries;

In principle, the inner portion of the matrix distribution (i.e. that part of the distribution excluding the outermost two circles of protrusions) does not have to have circular geometry, e.g. it might be given an orthogonal or honeycomb geometry. However, a problem with non-circular geometry in the inner portion is that it is then difficult to achieve a smooth geometrical transition between the inner and outlying portions of the distribution (whereby a geometrical mismatch would lead to poor wafer support in the vicinity of the transition zone). For this reason, it is best to endow the whole matrix distribution (both inner and outlying portions) with a circular geometry;

If the radial separation of the outlying circles in the matrix arrangement has a value d, then the value of x should be chosen so that $0.3 < x/d < 0.6$.

Tests performed with a substrate holder satisfying these specifications yielded excellent results, as will be further elucidated in the exemplary embodiments below.

The term "substantially circular" as used with regard to the wall should be interpreted as implying that at least 80% of the circumference of the wall follows a circular path. The remaining 20% of the wall may, of course, also follow the same circular path; alternatively, it may, for example, comprise a notch (so as to be compatible with notched wafers) or a straight portion (so as to be compatible with wafers having a flat edge). Similarly, the "concentric circles" in the matrix arrangement may deviate from exact circularity in the vicinity of such a notch or flat edge, but at least 80% of their circumference will be truly circular. In both cases, the term "accurate interval" is to be construed as referring to a perimetric distance (arc length) measured along the circumference of the wall or one of the concentric circles.

It should be noted that, where reference is made in this text to a distance between two objects (such as x, d or y, for example), such distance should be regarded as being measured between heart lines (centerlines) passing through the two objects concerned. For example, the distance d between two cylindrical protrusions is the distance between their cylindrical axes, measured parallel to the face from which the protrusions extend outward.

A preferential embodiment of the apparatus according to the invention is characterized in that x satisfies the relationship $0.43 < x/d < 0.47$. This range of values has been found to give a deflection of substantially zero magnitude along the edge of the wafer.

In a particular embodiment of the apparatus according to the invention, the quadrilateral (parallelepiped) area defined by a pair of adjacent protrusions in one circle and the corresponding nearest pair of adjacent protrusions in an adjacent circle has a substantially constant size, independent of the location of the quadrilateral in the matrix distribution. The term "substantially" as here employed should be interpreted as requiring the area of any first quadrilateral area to be equal to the area of any second quadrilateral area to within ±10%. Such an arrangement achieves a substantially homogeneous distribution of protrusions over the area of the wafer.

Another embodiment of the apparatus according to the invention is characterized in that the mutual radial separation of any pair of adjacent circles is substantially equal to d. The term "substantially equal" should here be interpreted as referring to a value which is equal to d within ±10%. Such an embodiment further optimizes the uniformity with which the backside of the wafer is supported.

In a specific embodiment of the apparatus specified in the previous paragraph, the face further comprises a plurality of hollow shafts disposed around the common center of the circles and through each of which a piston can be moved so as to protrude through the said substantially flat plane, such an embodiment being characterized according to the invention in that each shaft is separately enclosed by a retaining wall (vacuum wall) which protrudes from the face and which has the form of a polygon, and that the shortest distance y from any side of the polygon to an adjacent protrusion outside the polygon satisfies the relationship $0.25 < y/d < 0.45$. The purpose of the said pistons is to raise and lower the wafer off and onto the protrusions, so that the wafer can be transferred to or received from a handling robot arm. The particular range of values here stipulated for the ratio y/d was determined by the inventor on the basis of calculations and experiments, and is optimized to account for that fact that, since a vacuum may be present on the outside of the polygon but not on its inside, there is a substantial variation (as a function of in-plane position) in the perpendicular force exerted on the wafer in the vicinity of the polygon. Choosing y so as to satisfy the indicated relationship serves to minimize the distorting effects of such differential forces.

The term "shortest distance" as employed in the previous paragraph refers to the length of a line segment joining the relevant protrusion to the relevant side of the polygon, or to a linear extension of that side, and extending perpendicular to the said side.

A particular embodiment of an apparatus as specified in the previous paragraph is characterized in that the polygon is a hexagon and that satisfies the relationship $0.33 < y/d < 0.37$. This particular choice of geometry and spacing gives particularly satisfactory results with regard to wafer flatness.

In a further embodiment of the apparatus according to the invention, the value of H lies in the range 75 $\mu$m–125 $\mu$m. On the one hand, it is desirable to have the protrusions as low as possible, so as to optimize heat transfer between the substrate and the holder, this is particularly important in the case of a wafer, which should reach thermal equilibrium with the holder as quickly as possible so as to avoid contraction or expansion (with attendant overlay errors)

during exposure. However, on the other hand, if H is too small, this can result in too great a pressure drop between the wall and the vacuum aperture(s); this in turn slows vacuum generation and vacuum removal (thus reducing throughput) as well as resulting in a nonhomogeneous vacuum (thus reducing wafer flatness isometry). A good working compromise between these conflicting effects is achieved by choosing H to lie in the said range.

Another embodiment of the apparatus according to the invention is characterized in that 1 $\mu$m<H−h<5 $\mu$m. If H−h is too large, the result will be an unacceptable vacuum leak over the wall. On the other hand, H−h should be larger than the average (RMS) roughness of the backside of the wafer. Again, a good working compromise between these demands is achieved by choosing H−h to lie in the stipulated range.

It should be particularly noted that the invention lends itself for use in "single-stage" or "multi-stage" lithographic apparatus, is suited to various wafer sizes (e.g. 150-mm, 200-mm, 300-mm or 450-mm wafers), and can be employed both in current lithographic systems (using UV light) and next-generation lithographic devices (e.g. using EUV, electrons or ions, in a vacuum environment).

Although specific reference has been made hereabove to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

BRIEF DESCRIPTION OF THE DRAWINGS

The invention and its attendant advantages will be further elucidated with the aid of exemplary Embodiments and the accompanying schematic drawings, wherein:

FIG. 3 shows a perspective view of a lithographic projection apparatus according to the invention, containing a substrate holder as depicted in FIGS. 1 and 2;

Corresponding features in the various Figures are denoted by the same reference symbols.

DETAILED DESCRIPTION OF THE PREFERRED EMBODIMENTS

Embodiment 1

Figure 1:
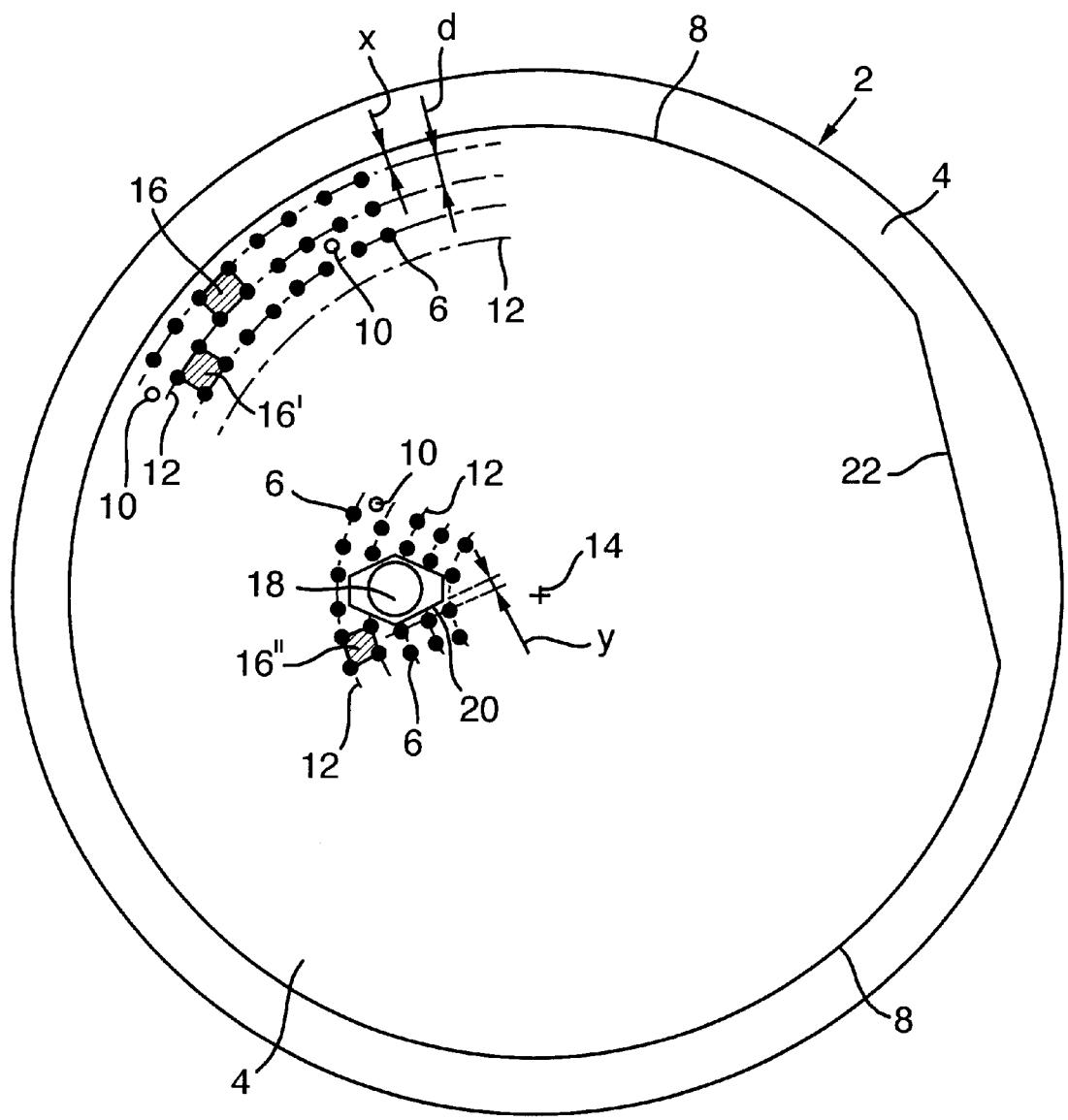
FIG. 1 renders a plan view of part of a substrate holder in accordance with the invention.
Figure 2:
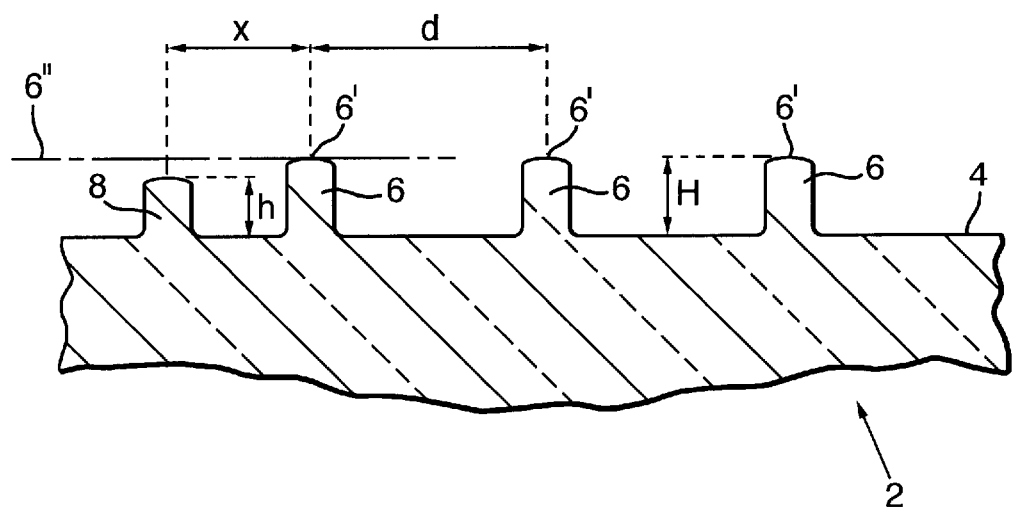
FIG. 2 renders a cross-sectional view of part of the subject of FIG. 1, taken along a diameter.

FIGS. 1 and 2 show various aspects of a substrate holder in accordance with the invention. The plan view in FIG. 1 is rendered in partial diametric cross-section in FIG. 2.

The depicted substrate holder comprises a plate 2 having a face 4 which is provided with a matrix arrangement of protrusions 6 (e.g. cylindrical burls emerging out of the face 4). Each protrusion 6 has an extremity 6' remote from the face 4 and is thus embodied (dimensioned) that the said extremities 6' all lie within a single substantially flat plane 6" at a height H above the face 4. The plate 2 further comprises a wall 8 which protrudes from the face 4, substantially encloses the matrix arrangement, and has a substantially uniform height h above the face 4, whereby h<H. The face 4 inside the wall 8 is provided with a distributed plurality of apertures 10 extending through the plate 2; through these apertures 10, the area enclosed by the wall 8 is connected to a vacuum pump. For the sake of clarity, only a small subset of the various protrusions 6, apertures 10 and circles 12 are shown in the Figures; in reality, the protrusions 6 are distributed over substantially the whole area enclosed by the wall 8.

As here depicted, the matrix arrangement comprises a series of concentric circles 12 along which the protrusions 6 are disposed at substantially regular accurate intervals. The wall 8 is also circle, except in that it contain a relatively short straight portion 22. The wall 8 and circles 12 are concentric about a common center 14. The radial separation of the two outermost circles 12 is d, and, in this particular embodiment, the radial separation of any other pair of adjacent (consecutive) circles 12 is also d. On the other hand, the radial distance between the wall 8 and the circle 12 nearest thereto is x. The value of x is engineered such that the ratio x/d lies in the range 0.3–0.6, and, more specifically, has a value of approximately 0.45.

Also depicted as shaded features in the Figure are three different quadrilateral (parallelepiped) areas 16,16',16", each of which is defined by an adjacent pair of protrusions 6 in one circle 12 and the nearest adjacent pair of protrusions 6 in an adjacent (consecutive) circle 12. In this embodiment, the accurate spacings of adjacent protrusions 6 in the various circles 12 are chosen such that all such quadrilateral areas 16 are of substantially the same size (same area).

FIG. 1 also shows one of a series of hollow shafts 18 which are symmetrically disposed around the common center 14 of the circles 12. Through each shaft 18 a piston can be moved so as to protrude through the flat plane 6" defined by the outward facing extremities 6' of the protrusions 6. Each shaft 18 is separately enclosed by a retaining wall 20 which protrudes outward from the face 4 and which has the form of a polygon. The retaining wall 18 is thus configured that the shortest distance y from any side of the polygon 20 to an adjacent protrusion 6 outside the polygon 20 satisfies the relationship 0.25<y/d<0.45, with a specific value y/d= 0.32.

In this particular example, the plate 2 is comprised of vitreous material, e.g. ceramic or glass. The height H of the protrusions 6 is approximately 100 $\mu$m, whereas the height h of the wall 8 (and also of the retaining wall 20) is approximately 97 $\mu$m. The value of d is, for example, of the order of 1 mm. Such protrusions 6 and walls 8,20 can be manufactured by a mechanical or chemical subtractive process. For example, a bare vitreous plate can be provided on one face with a mask corresponding to the desired positions of the protrusions 6 and walls 8,20, and the unmasked portions of the plate can then be exposed to an etchant for a pre-determined time.

Embodiment 2

FIG. 3 renders a schematic perspective view of a lithographic projection apparatus according to the invention. The apparatus comprises:

a radiation system 7 for supplying a projection beam 25 of radiation (e.g. ultraviolet (UV) light, Extreme UV ($\lambda$~5–20 nm), or a beam of electrons or ions);

a mask table 5 provided with a mask holder 27 for holding a mask 29 (e.g. a reticle);

a substrate table 1 provided with a substrate holder 17 for holding a substrate 19 (e.g. a resist-coated silicon wafer). According to the invention, the substrate holder 17 comprises a plate 2 as further elucidated in Embodiment 1 above;

a projection system 3 (e.g. a lens, mirror group or catadioptric system, or a particle focusing system) for imaging an irradiated portion of the mask 29 onto a target portion 35 (die) of the substrate 19.

The radiation system 7 comprises a source 9 (e.g. a Hg lamp or excimer laser) which produces a beam 33 of radiation. This beam 33 is passed along various optical components (such as a stop 11 and selective mirrors 13,15, and/or components such as a condensor lens, intensity integrator, etc.) so that the beam 25 emerging from the system 7 is substantially collimated, monochromatic and uniformly intense throughout its cross-section.

The beam 25 subsequently intercepts a reticle 29 which is held in a mask holder 27 on a mask table 5. With the aid of the displacement means 31, the mask table 5 can be moved accurately back and forth at least along the X-direction (the so-called scan direction).

Having passed through (or been reflected from) the reticle 29, the beam 25 passes through a projection system 3, which focuses the beam 25 onto a die 35 of the wafer 19. With the aid of the displacement means 21, the substrate table 1 can also be moved accurately back and forth along the X-direction (scan direction). However, the substrate table 1 can also be moved back and forth in the Y-direction.

The depicted apparatus can be used in two different modes:

In step mode, the reticle table 5 is kept stationary, and an entire reticle image is projected in one go (i.e. a single "flash") onto a wafer die 35. The substrate table 1 is then shifted in the X and/or Y directions so that a different die 35 can be irradiated by the (stationary) beam 25;

In scan mode, essentially the same scenario applies, except in that a given die 35 is not exposed in a single "flash". Instead, the reticle table is moved in the scan direction with a speed v, so that the projection beam 25 is caused to scan over a reticle image, and the substrate table 1 is simultaneously moved in the same or opposite direction at a speed V=Mv, in which M is the magnification of the projection system 3 (typically, M=¼ or ⅕). In this manner, a relatively large die can be exposed, without having to compromise on resolution.

Embodiment 3

Figure 4:
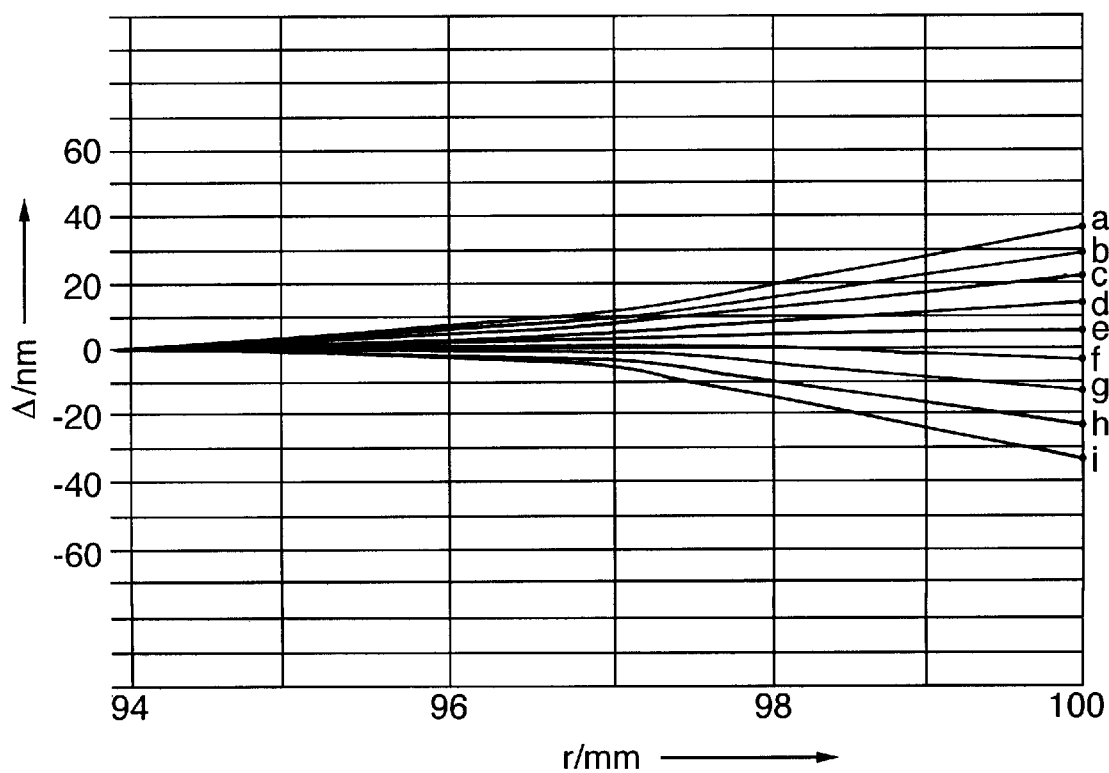
FIG. 4 graphically depicts the vertical deformation Δ of a wafer as a function of wafer radius r in a substrate holder according to the invention, for various values of the radial distance x from the wall to the outermost circle of protrusions in that holder.

FIG. 4 graphically depicts the vertical deformation Δ (in nm) of a 200-mm wafer 19 as a function of wafer radius r (in mm) in a plate 2 as described in Embodiment 1, for various values of the radial distance x from the wall 8 to the outermost circle 12 of protrusions 6. The radius r is measured from the common center 14. In this particular embodiment, the wall 8 is located at r=97.75 mm, and the value of d is 2.54 mm. The curves a–i in FIG. 4 correspond to various values of x, starting at x=1 mm (curve a) and increasing in steps of 0.05 mm to x=1.4 mm (curve i). In accordance with the invention, all of these values of x satisfy the relationship 0.39<x/d<0.55.

The maximum value of Δ is 37 nm (curve a), whereas the minimum value of Δ is about 4 nm (curve f). All values of Δ in the Figure fall well within a tolerance of 100 nm (and most within a tolerance of 50 nm).

What is claimed is:

1. A lithographic projection apparatus comprising:

a radiation system constructed and arranged to supply a projection beam of radiation;

a mask table provided with a mask holder;

a substrate table provided with a substrate holder;

a projection system constructed and arranged to image an irradiated portion of a mask held by said mask holder onto a target portion of a substrate held by said substrate holder, the substrate holder comprising a plate having a face which is provided with a matrix arrangement of protrusions, each protrusion having an extremity remote from the face and being thus embodied that said extremities all lie within a single substantially flat plane at a height H above the face, the substrate holder further comprising a wall which protrudes from the face, substantially encloses the matrix arrangement, and has a substantially uniform height h above the face, whereby h<H, the face inside the wall being provided with at least one aperture extending through the plate and through which the area enclosed by the wall can be accessed, wherein:

the matrix arrangement comprises a series of concentric circles whereby the protrusions are disposed along each circle at substantially regular arcuate intervals;

the wall is substantially circular, and is concentric with said circles;

the radial distance x between the wall and the circle nearest thereto satisfies the relationship 0.3<x/d<0.6, where d is the mutual radial separation of the two circles nearest the wall.

2. An apparatus according to claim 1, wherein x satisfies the relationship 0.43<x/d<0.47.

3. An apparatus according to claim 1, wherein the quadrilateral area defined by a pair of adjacent protrusions in one circle and the corresponding nearest pair of adjacent protrusions in an adjacent circle has a substantially constant size, independent of the location of the quadrilateral in the matrix distribution.

4. An apparatus according to claim 1, wherein the mutual radial separation of any pair of adjacent circles is substantially equal to d.

5. An apparatus according to claim 4, in which the face further comprises a plurality of hollow shafts disposed around the common center of the circles and through each of which a piston can be moved so as to protrude through said substantially flat plane, wherein each shaft is separately enclosed by a retaining wall which protrudes from the face and which has the form of a polygon, and the shortest distance y from any side of the polygon to an adjacent protrusion outside the polygon satisfies the relationship 0.25<y/d<0.45.

6. An apparatus according to claim 5, wherein the polygon is a hexagon and y satisfies the relationship 0.33<y/d<0.37.

7. An apparatus according to claim 1, wherein H satisfies the relationship 75 μm<H<125 μm.

8. An apparatus according to claim 7, wherein h satisfies the relationship 1 μm<H−h<5 μm.

9. A substrate holder for a lithographic projection apparatus, comprising:

plate having a face which is provided with a matrix arrangement of protrusions, each protrusion having an extremity remote from the face and being thus embodied that said extremities all lie within a single substantially flat plane at a height H above the face; and a wall which protrudes from the face, substantially encloses the matrix arrangement, and has a substantially uniform height h above the face, whereby h<H, the face inside the wall defining at least one aperture extending through the plate and through which the area enclosed by the wall can be accessed, wherein:

the matrix arrangement comprises a series of concentric circles whereby the protrusions are disposed along each circle at substantially regular accurate intervals;

the wall is substantially circular, and is concentric with said circles;

the radial distance x between the wall and the circle nearest thereto satisfies the relationship $0.3<x/d<0.6$, where d is the mutual radial separation of the two circles nearest the wall.

* * * * *